(12) United States Patent
Bishop et al.

(10) Patent No.: US 12,114,581 B2
(45) Date of Patent: Oct. 8, 2024

(54) MAGNESIUM ION BASED SYNAPTIC DEVICE

(71) Applicant: International Business Machines Corporation, Armonk, NY (US)

(72) Inventors: Douglas M. Bishop, New York, NY (US); Martin Michael Frank, Dobbs Ferry, NY (US); Teodor Krassimirov Todorov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 65 days.

(21) Appl. No.: 18/117,755

(22) Filed: Mar. 6, 2023

(65) Prior Publication Data

US 2023/0210027 A1    Jun. 29, 2023

Related U.S. Application Data

(62) Division of application No. 17/496,235, filed on Oct. 7, 2021, now Pat. No. 11,690,304, which is a division of application No. 16/828,390, filed on Mar. 24, 2020, now Pat. No. 11,201,284.

(51) Int. Cl.
*H10N 70/20* (2023.01)
*H10N 70/00* (2023.01)

(52) U.S. Cl.
CPC ......... *H10N 70/253* (2023.02); *H10N 70/021* (2023.02); *H10N 70/245* (2023.02); *H10N 70/8416* (2023.02); *H10N 70/8833* (2023.02)

(58) Field of Classification Search
CPC . H10N 70/8833; H10N 70/245; H10N 70/826
See application file for complete search history.

(56) References Cited

U.S. PATENT DOCUMENTS

| | | | |
|---|---|---|---|
| 4,839,700 A * | 6/1989 | Ramesham | ........ H10N 70/8833 338/34 |
| 7,652,907 B2 | 1/2010 | Bloch et al. | |
| 8,218,351 B2 | 7/2012 | Bloch et al. | |
| 8,614,432 B2 | 12/2013 | Pickett et al. | |
| 8,759,809 B2 | 6/2014 | Liu et al. | |
| 10,083,974 B1 | 9/2018 | Huang et al. | |
| 10,256,405 B2 | 4/2019 | Afzali-Ardakani et al. | |
| 2009/0010040 A1 | 1/2009 | Takase | |
| 2018/0293487 A1 | 10/2018 | Copel et al. | |

OTHER PUBLICATIONS

E.J. Fuller et al., "Li-ion Synaptic Transistor for Low Power Analog Computing," Advanced Materials, Jan. 2017, 33 pages, vol. 29, No. 4.

(Continued)

*Primary Examiner* — Shih Tsun A Chou
(74) *Attorney, Agent, or Firm* — Daniel Yeates; Ryan, Mason & Lewis LLP

(57) ABSTRACT

A method of fabricating a synaptic device is provided. The method includes forming a channel layer between a first terminal and a second terminal. The channel layer varies in resistance based on a magnesium concentration in the channel layer. The method further includes forming an electrolyte layer. The electrolyte layer includes a magnesium ion conductive material. A third terminal is formed over the electrolyte layer and applies a signal to the electrolyte layer and the channel layer.

20 Claims, 6 Drawing Sheets

(56) References Cited

OTHER PUBLICATIONS

E. Roedern et al., "Magnesium Ethylenediamine Borohydride as Solid-State Electrolyte for Magnesium Batteries," Scientific Reports, Apr. 7, 2017, 6 pages, vol. 7.
M. Zhang et al., "Communication-Investigation of Anatase-TiO2 as an Efficient Electrode Material for Magnesium-Ion Batteries," Journal of the Electrochemical Society, Aug. 31, 2016, pp. 2368-2370, vol. 163, No. 10.
Y. Wang et al., "Emerging Non-Lithium Ion Batteries," Energy Storage Materials, Jul. 2016, pp. 103-129, vol. 4.
R.C. Massé et al., "Beyond Li-ion: Electrode Materials for Sodium- and Magnesium-Ion Batteries," Science China Materials, Sep. 2015, pp. 715-766, vol. 58, No. 9.
R. Wang et al., "Electrochemical Intercalation of Mg2+ into Anhydrous and Hydrated Crystalline Tungsten Oxides," Langmuir, Jul. 21, 2017, pp. 9314-9323, vol. 33, No. 37.
S. Higashi et al., "A Novel Inorganic Solid State Ion Conductor For Rechargeable Mg Batteries," Chemical Communications, Feb. 9, 2014, pp. 1320-1322, vol. 50.
S. Kim et al., "Metal-oxide based, CMOS-compatible ECRAM for Deep Learning Accelerator," IEEE International Electron Devices Meeting (IEDM), Dec. 2019, 4 pages.
J. Tang et al., "ECRAM as Scalable Synaptic Cell for High-Speed, Low-Power Neuromorphic Computing," IEEE International Electron Devices Meeting (IEDM), Dec. 2018, 4 pages.
E.H. Snow et al., "Ion Transport Phenomena in Insulating Films," Journal of Applied Science, May 1965, pp. 1664-1673, vol. 36, No. 5.
List of IBM Patents or Patent Applications Treated as Related.

\* cited by examiner

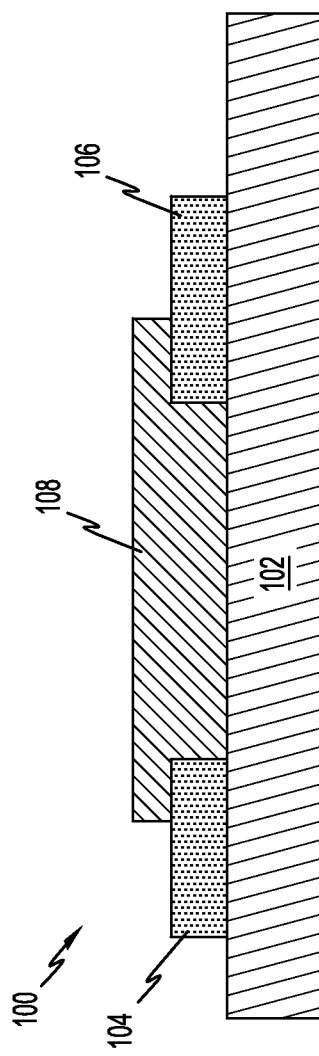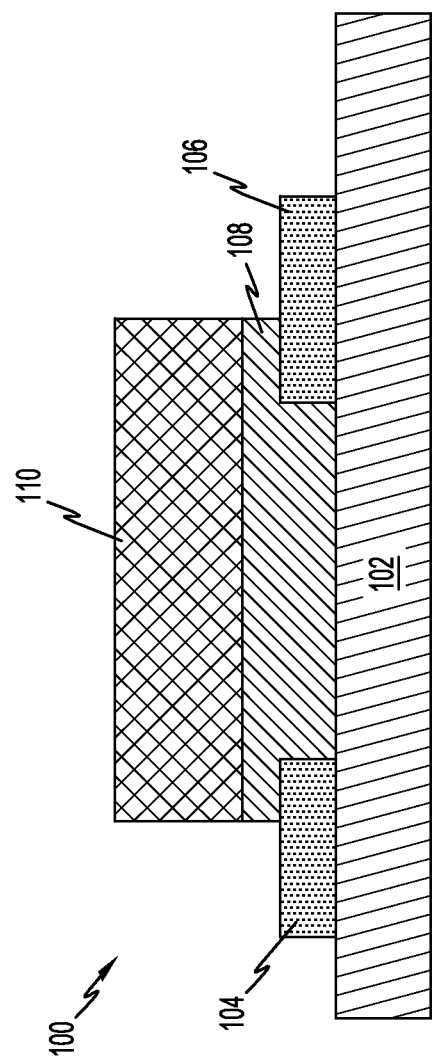

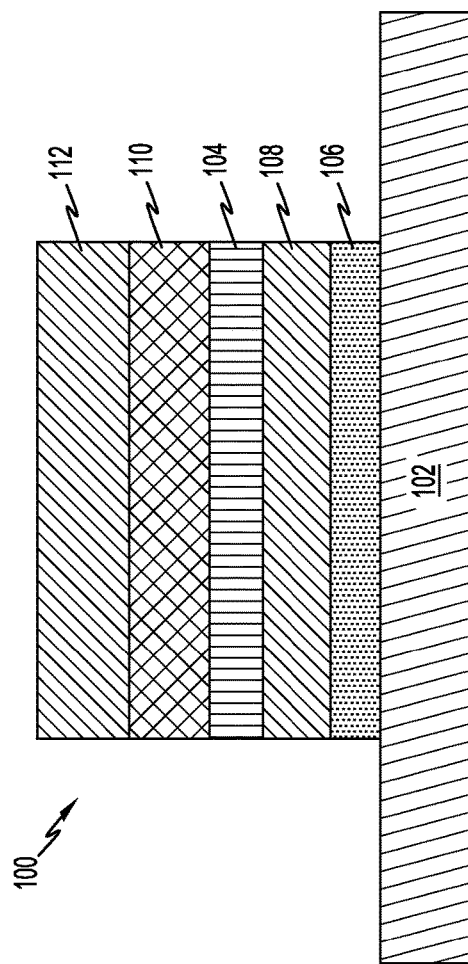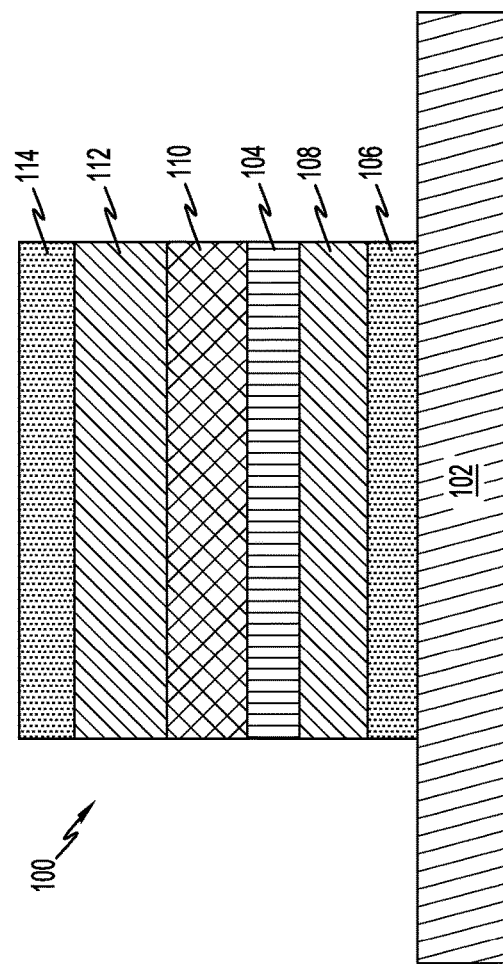
FIG. 2C
FIG. 2D

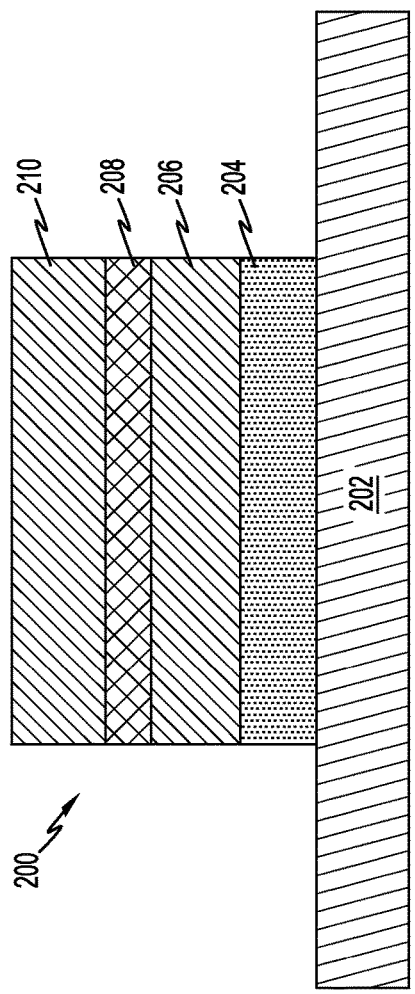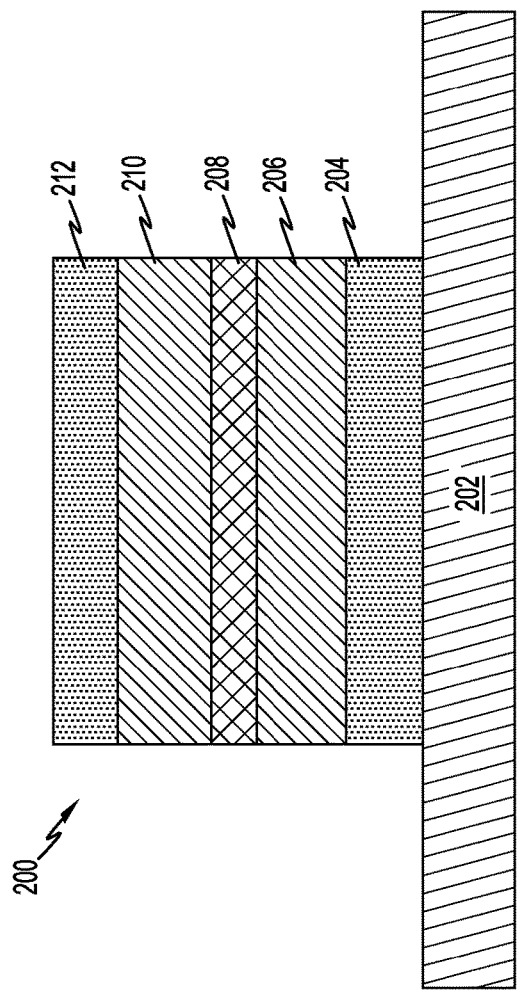

MAGNESIUM ION BASED SYNAPTIC DEVICE

BACKGROUND

Scaling in complementary metal-oxide-semiconductor (CMOS) has led to growing interest in alternative computing synaptic devices, for example, neuromorphic computing devices. Neuromorphic computing uses very-large-scale integration (VLSI) systems, including electronic analog circuits, to mimic neuro-biological architectures present in the nervous system. On the hardware level, memristors, threshold switches, and transistors, for example, can be used to implement neuromorphic computing devices. For electrochemical-based neuromorphic devices, lithium is commonly used because such systems have demonstrated multiple states, symmetrical conductance operation as well as non-volatility and low power.

SUMMARY

Embodiments of the invention include structures and methods for forming synaptic devices. For example, one exemplary embodiment includes a method comprising forming a channel layer between a first terminal and a second terminal. The channel layer varies in resistance based on magnesium concentration in the channel layer. The method further comprises forming an electrolyte layer over the channel layer. The electrolyte layer comprises a magnesium ion conductive material. The method further comprises forming a third terminal over the electrolyte layer for applying a signal to the electrolyte layer and the channel layer.

Another exemplary embodiment includes a synaptic device comprising a channel layer disposed between a first terminal and a second terminal. The channel layer is configured to vary in resistance based on magnesium concentration in the channel layer. The synaptic device further comprises an electrolyte layer disposed over the channel layer and configured to conduct magnesium ions with the channel layer in accordance with an applied input signal. The synaptic device further comprises a third terminal disposed over the electrolyte layer and configured to apply a signal to the electrolyte layer and the channel layer.

Another exemplary embodiment includes a method of fabricating a synaptic device comprising forming a channel layer over a first terminal. The channel layer varies in resistance based on a magnesium concentration in the channel layer. The method further comprises forming a barrier layer over the channel layer. The method further comprises forming a magnesium reservoir layer over the barrier layer. The magnesium reservoir layer transports magnesium ions through the barrier layer at a threshold applied input signal. The method further comprises forming a second terminal over the magnesium reservoir layer for applying the signal to the magnesium reservoir layer.

These and other features, objects and advantages of the present invention will become apparent from the following detailed description of illustrative embodiments thereof, which is to be read in connection with the accompanying drawings.

BRIEF DESCRIPTION OF THE DRAWINGS

FIG. 1A is a schematic cross-sectional side view of a synaptic structure at a first-intermediate stage of fabrication, according to one or more illustrative embodiments.

FIG. 1B is a schematic cross-sectional side view of the synaptic structure at a second-intermediate stage of fabrication, according to one or more illustrative embodiments.

FIG. 2C is a schematic cross-sectional side view of the synaptic structure at a third-intermediate stage of fabrication, according to one or more alternative illustrative embodiments.

FIG. 2D is a schematic cross-sectional side view of the synaptic structure at a fourth-intermediate stage of fabrication, according to one or more alternative illustrative embodiments.

FIG. 3C is a schematic cross-sectional side view of the synaptic structure at a third-intermediate stage of fabrication, according to one or more alternative illustrative embodiments.

FIG. 3D is a schematic cross-sectional side view of the synaptic structure at a fourth-intermediate stage of fabrication, according to one or more alternative illustrative embodiments.

DETAILED DESCRIPTION

Figure 1C:
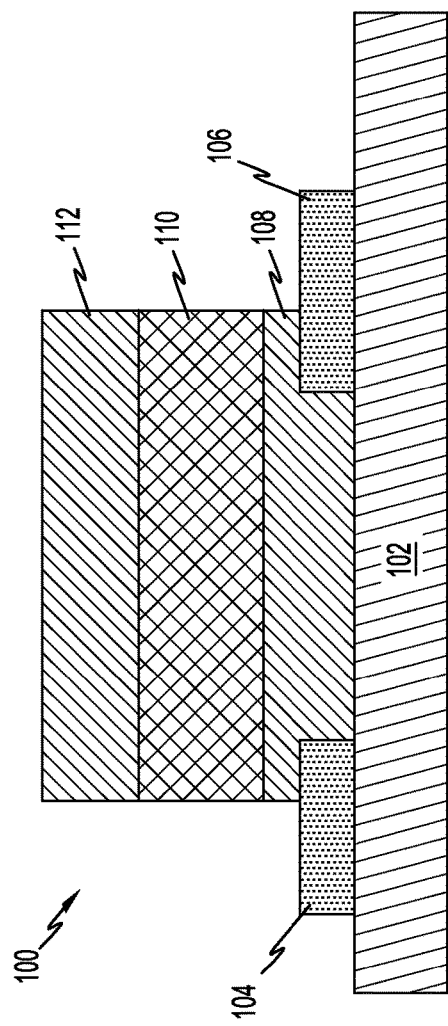
FIG. 1C is a schematic cross-sectional side view of the synaptic structure at a third-intermediate stage of fabrication, according to one or more illustrative embodiments.

This disclosure relates generally to synaptic structure fabrication techniques and, in particular, to structures and methods for fabricating synaptic devices having settable resistances.

Devices utilizing ion-motion have gained increasing research interest due to potential applications as a reconfigurable memory for storage or analog memrister for neuromorphic computing. This concept is attractive because the devices easily allow multiple states, while also being non-volatile and requiring low power for programming. Device physics and experimental results show improved switching symmetry which is essential for efficient neuromorphic computing and a current roadblock for many competing technologies.

Ion-intercalation devices commonly rely on lithium such as in those devices in the battery industry. For example, lithium ion ($Li^+$) intercalation materials, for example, $LiCoO_2$, that exhibit resistivity changes as a function of lithium content have been proposed for neuromorphic and analog computing applications, such as synaptic transistors. Lithium ion synaptic transistors include three terminals and are solid state, nonvolatile oxidation-reduction (redox) transistors with a resistance switching mechanism based on intercalation of lithium ion dopants into a channel (e.g., a LiCoO₂ channel). Lithium ion transistors are advantageous for neuromorphic applications because they use the low energy process of ion insertion/extraction for resistance switching, which means that small voltages can be used. Despite these advantages, problems exist with the use of lithium during semiconductor fabrication. For example, one problem with the use of lithium is a concern regarding contamination of conventional CMOS or memory devices/wafers, as drifting ions can cause device instabilities.

One or more illustrative embodiments herein address the above-described shortcomings by providing a vertically integrated, solid-state magnesium synaptic device for neuromorphic and analog computing applications. The synaptic device herein employs magnesium ions that can form a stable oxide and thus will be 'deactivated' easily thereby avoiding contamination. In addition, other advantages of the synaptic device include the improved safety due to the solid state, no use of flammable liquids, lack of any magnesium-dendrite formation, reduced operating voltages compared to lithium-based devices and reduced raw material cost compared to lithium-based devices.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g., an interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

According to illustrative embodiments, a 3-terminal device includes source and drain electrodes, a tunable resistive channel, an electrolyte layer, an optional magnesium reservoir layer, and a gate electrode. According to one or more embodiments, a 3-terminal synaptic device including the features described herein can be formed in a lateral manner, where a source and drain are formed at the same level in the layer stack, and of the same or different dimensions (e.g. same or different thicknesses, same or different widths, etc.), a variable resistance channel layer is formed between the source and the drain, and an electrolyte layer is formed over the channel layer, and a gate electrode is formed over the electrolyte layer. According to one or more embodiments, a 3-terminal synaptic device including the features described herein can be formed in a stacked manner, where a drain and source are formed at different levels in the layer stack, and of the same or different dimensions (e.g. same or different thicknesses, same or different widths, etc.), a variable resistance channel layer is formed between the source and the drain, a channel layer is formed over the electrolyte layer, and a gate electrode is formed over the electrolyte layer. An optional magnesium reservoir layer can be formed in the either of the lateral or stacked embodiments.

Note that the same reference numeral (100) is used to denote a 3-terminal device according to the embodiments illustrated in FIGS. 1A through 2D. Referring now to the figures, FIG. 1A is a cross-sectional view of 3-terminal synaptic device 100 illustrating an initial step in forming the synaptic device. The figure illustrates an exemplary substrate 102, a source electrode 104, a drain electrode 106, and a variable resistance channel layer 108.

A base or substrate 102 is shown, upon which the synaptic device is fabricated. In one or more embodiments, base 102 can be a semiconductor material, though it should be understood that other materials can be used instead. The base 102 can be a bulk-semiconductor substrate. In one example, a bulk-semiconductor substrate can be a silicon-containing material. Suitable silicon-containing materials for the bulk-semiconductor substrate include, for example, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, for example, germanium, gallium arsenide, gallium nitride, cadmium telluride, and zinc selenide. Although not depicted in the present figures, the substrate can also be a semiconductor on insulator (SOI) substrate. Other exemplary substrate materials include glass, sapphire, and diamond. In one or more embodiments, the base 102 can be another device/chip on which the synaptic device is fabricated directly (without a substrate).

If desired, an insulator layer (not shown) can be formed on base 102, such as when the base 102 is formed from a semiconductor or conductive material. The insulator layer can be formed from silicon nitride, but it should be understood that any appropriate insulator material can be formed by any appropriate process to form an insulator layer.

Source structure 104 and drain structure 106, also referred herein as source and drain electrodes, are formed either over the insulator layer (not shown), or directly over the base 102. In one embodiment, source structure 104 and drain structure 106 include one or more of the same or different conductive metals such as, for example, aluminum, copper, platinum, gold, tungsten, titanium, carbon, nitrogen, TiN, Al, TiAlC, AlC, and TiC or any combination thereof. The source structure 104 and drain structure 106 can be formed by any suitable deposition process such as a physical vapor deposition (PVD) process, whereby a sputtering apparatus can include electron-beam evaporation, thermal evaporation, direct-current diode systems, radio frequency sputtering, magnetron sputtering, or ionized metal plasma sputtering. The deposited layer can be etched to form the source structure 104 and drain structure 106 by any appropriate photolithographic process. In one or more embodiments of the present invention the drain and source are formed in a symmetric manner, i.e., both, the source and the drain are substantially of the same dimensions. In other embodiments of the present invention, the source and drain can have different dimensions, for example, the height (or depth) of the source is more (or less) than the drain. For example, according to one or more embodiments, the source structure 104 and drain structure 106 can independently have a thickness of about 1 to about 200 nanometers (nm). The thickness of the source structure 104 and drain structure 106 however is not intended to be limited and can be tailored to the particular application.

A variable-resistance channel layer 108 is then formed over and between the source and drain structures 104 and 106 to form a tunable resistive channel layer (i.e., channel layer). In one or more illustrative embodiments, the variable-resistance channel layer 108 is formed from a variable-resistance material that changes resistance based on its magnesium content and is composed of metal-oxides such as WOx, TiOx, VOx, TaOx, HfOx, etc. For example, the variable-resistance material can be $WO_3$, $TiO_2$, $HfO_2$, $V_2O_5$, $CeO_2$ and $Mo_6S_8$. The variable-resistance channel layer 108 can include a material that is the same or different than the reservoir layer 112 (see FIG. 1C). The variable-resistance channel layer 108 can be formed by any appropriate deposition process, for example, chemical vapor deposition (CVD), plasma enhanced chemical vapor deposition (PECVD), PVD, plating, thermal or e-beam evaporation, or sputtering. According to one or more embodiments, the variable-resistance layer 108 can have a thickness of about 1 to about 500 nm. The thickness of the variable-resistance channel layer 108 however is not intended to be limited and can be tailored to the particular application.

In one illustrative embodiment, the variable-resistance channel layer 108 accepts magnesium ions by intercalation, where the oxide material creates a crystalline structure and magnesium ions fit into gaps in that crystalline structure under an appropriate voltage. The voltage overcomes the repulsive force created by any electrical charge already present in the variable-resistance layer 108, forcing more charged ions to occupy that layer. In a second illustrative embodiment, the magnesium ions remain near the electrolyte-channel interface and modify the electrical properties at that interface.

FIG. 1B is a cross-sectional side view of an electrolyte layer 110 arranged over the variable-resistance channel layer 108. The electrolyte layer 110 includes an ion conductive, electrically insulating solid material. In general, the electrolyte layer 110 is magnesium ion conductive and includes, for example, a magnesium ion conductive material such as $Mg(BH_4)(NH_2)$, $Mg(En)_x(BH_4)_2$, $Mg(En)_x(BH_4)_2$, $Mg_{1.4}Zr_4P_6O_{24.4}+Zr_2O(PO_4)_2$, or $MgZr_4(PO_4)_6$. The electrolyte layer 110 can be deposited by a suitable deposition process, for example, CVD, PECVD, PVD, plating, thermal or e-beam evaporation, or sputtering. According to one or more embodiments, the electrolyte layer 110 has a thickness of about 1 to about 500 nm. The thickness of the electrolyte layer 110 however is not intended to be limited and can be tailored to the particular application.

FIG. 1C is a cross-sectional side view of a reservoir layer 112 arranged over the electrolyte layer 110. The reservoir layer 112 is any layer where magnesium ions can be hosted and transported under the appropriate applied voltage. These layers could be Mg-ion intercalation compounds or metal alloys, or a Mg metal layer alone as long as they allow diffusion of Mg with the appropriate applied voltage. In the absence of an Mg-reservoir layer metal ions can come from the electrolyte itself. Suitable material for the magnesium reservoir layer includes, for example, metal oxides such as WOx, TiOx, VOx, TaOx, and HfOx, or metal alloys thereof or carbon-based compounds (e.g., graphite or nanotubes), which reversibly convert to a nonstoichiometric magnesium by diffusing magnesium ions when subjected to an appropriate voltage. The reservoir layer 112 is deposited over the electrolyte layer 110 by, for example, CVD, PECVD, PVD, plating, thermal or e-beam evaporation, or sputtering. According to one or more embodiments, the reservoir layer 112 can have a thickness of about 0.1 to about 500 nm. The thickness of the reservoir layer 112 however is not intended to be limited and can be tailored to the particular application.

Figure 1D:
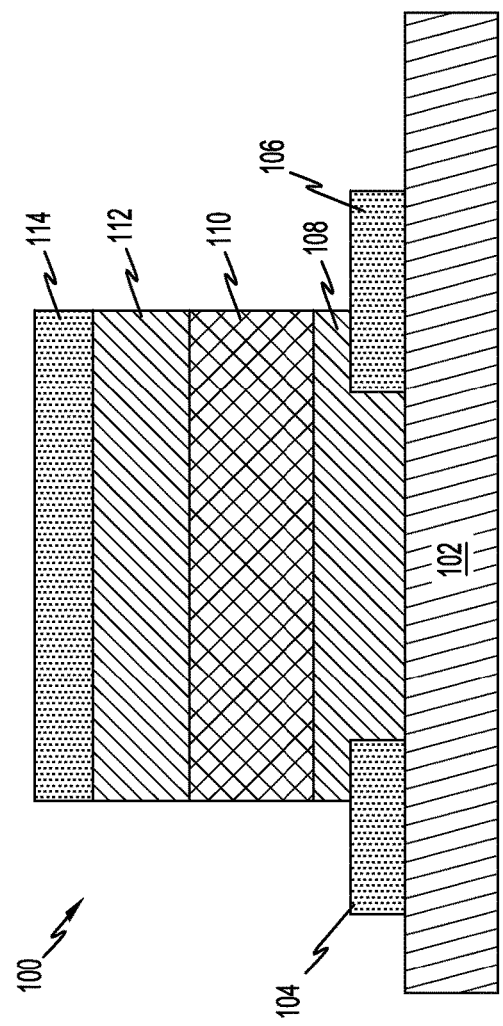
FIG. 1D is a schematic cross-sectional side view of the synaptic structure at a fourth-intermediate stage of fabrication, according to one or more illustrative embodiments.

FIG. 1D is a cross-sectional side view of a gate layer 114, also referred to as a gate electrode, arranged over the reservoir layer 112, when present, or electrolyte layer 110. The gate layer 114 applies a voltage across the device that forces metal ions, for example, magnesium ions into the variable-resistance channel layer 108. The gate layer 114 includes one or more conductive materials, such as one or more conductive metals. Suitable conductive metals for the gate layer 114 include, for example, aluminum, platinum, gold, tungsten, titanium, carbon, TiN, Al, TiAlC, AlC, TiC or any combination thereof. The gate layer may further include sidewall spacers, a gate cap, dielectric layers, and other structures depending on the device type and design. The conductive metals can be deposited by a suitable deposition process, for example, CVD, PECVD, PVD, plating, thermal or e-beam evaporation, or sputtering.

An alternate illustrative embodiment of a 3-terminal device according to FIGS. 1A-1D is shown in FIGS. 2A-2D which refer to a synaptic device 100 that includes source and drain electrodes, a tunable resistive channel, an electrolyte layer, an optional magnesium reservoir layer, and a gate electrode. According to one or more embodiments, a 3-terminal synaptic device including the features described herein can be formed in a vertical manner, where a drain is first formed in the layer stack, then variable resistance channel layer followed by the source, the electrolyte layer and the gate layer.

Figure 2A:
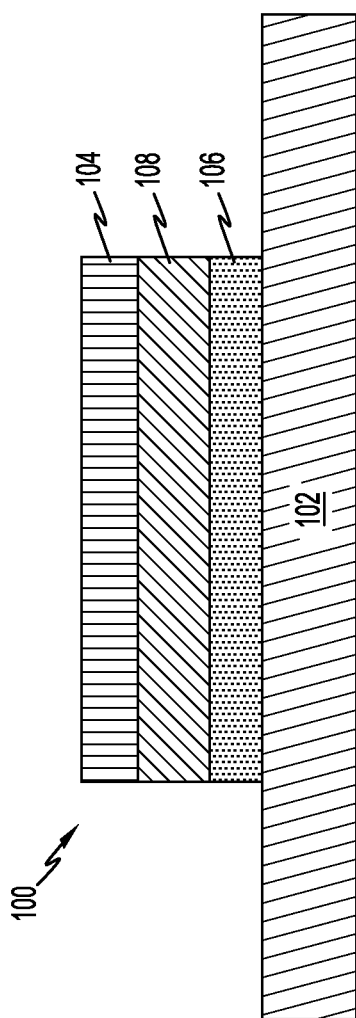
FIG. 2A is a schematic cross-sectional side view of a synaptic structure at a first-intermediate stage of fabrication, according to one or more alternative illustrative embodiments.

FIG. 2A is a cross-sectional side view of a variable-resistance channel layer 108 and a drain structure 106 arranged on substrate 102. Substrate 102, drain structure 106 and variable-resistance layer 108 can be made of any of the same materials and deposited in the same manner as discussed above.

Figure 2B:
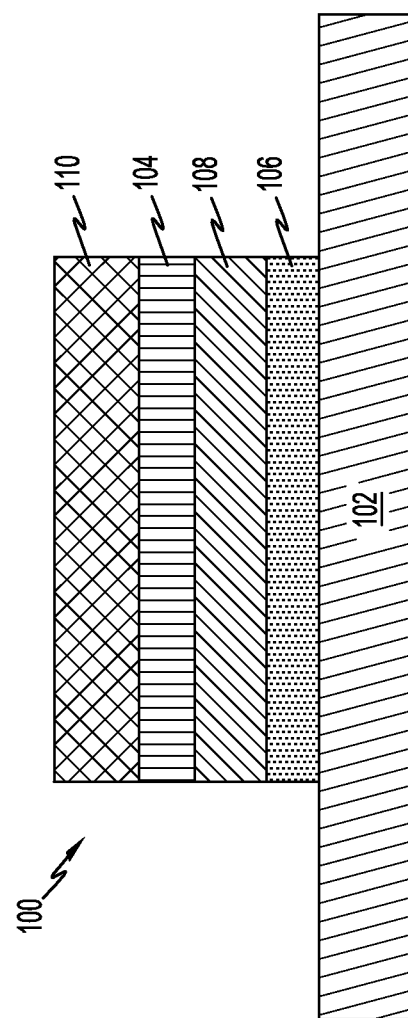
FIG. 2B is a schematic cross-sectional side view of the synaptic structure at a second-intermediate stage of fabrication, according to one or more alternative illustrative embodiments.

FIG. 2B is a cross-sectional side view of a source structure 104 arranged on variable-resistance channel layer 108. By arranging the synaptic device in this manner, the source structure 104 allows for diffusion of ions. This can be achieved when source structure 104 is a porous layer or a solid material with high diffusivity such as $Mg(BH_4)(NH_2)$, $Mg(En)_x(BH_4)_2$, $Mg(En)_x(BH_4)_2$, $Mg_{1.4}Zr_4P_6O_{24.4}+Zr_2O(PO_4)_2$, or $MgZr_4(PO_4)_6$.

FIG. 2C is a cross-sectional side view of optional reservoir layer 112 and electrolyte layer 110 arranged on source structure 104. Electrolyte layer 110 and reservoir layer 112 can be comprised of any of the same materials and deposited in the same manner as discussed above.

FIG. 2D is a cross-sectional side view of a gate electrode 114 arranged either on optional reservoir layer 112, or electrolyte layer 110. Gate electrode 114 can be made of any of the same materials and deposited in the same manner as discussed above.

Figure 3A:
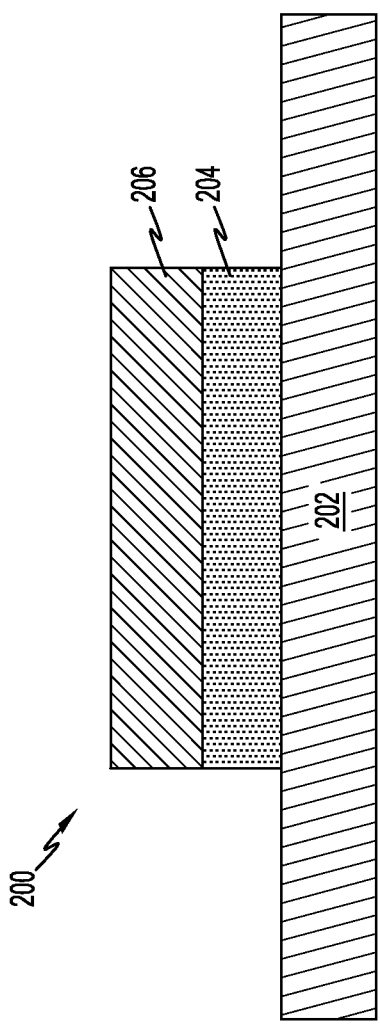
FIG. 3A is a schematic cross-sectional side view of a synaptic structure at a first-intermediate stage of fabrication, according to one or more alternative illustrative embodiments.

According to a third illustrative embodiment, FIGS. 3A-3D refer to a synaptic device 200 that is a 2-terminal device which includes a source electrode, a tunable resistive channel, a magnesium reservoir layer, and a gate electrode. FIG. 3A is a cross-sectional side view of a variable-resistance channel layer 206 and a source structure 204 arranged on substrate 202. Substrate 202, source structure 204 and variable-resistance channel layer 206 can be made of any of the same materials and deposited in the same manner as discussed above for substrate 102, source structure 104 and variable-resistance channel layer 108.

Figure 3B:
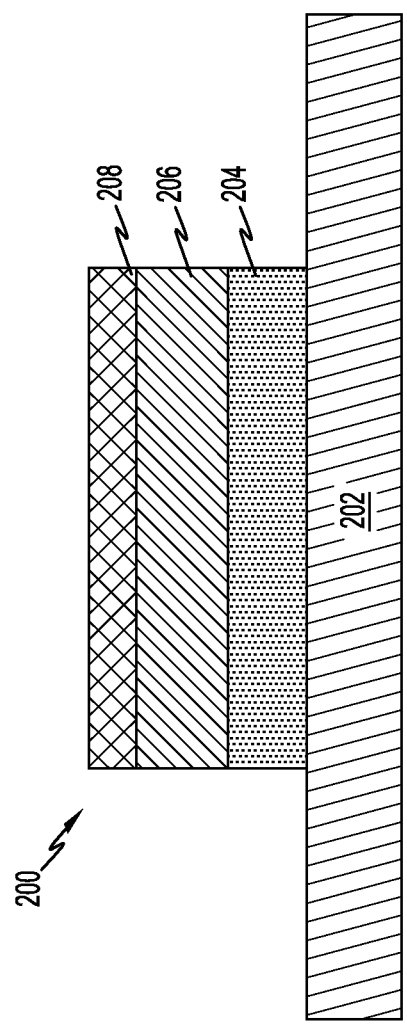
FIG. 3B is a schematic cross-sectional side view of the synaptic structure at a second-intermediate stage of fabrication, according to one or more alternative illustrative embodiments.

FIG. 3B is a cross-sectional side view of a barrier layer 208 arranged on variable-resistance channel layer 206. Barrier layer 208 can prevent unwanted diffusion of magnesium ions between the variable-resistance channel layer 206 and the reservoir layer 210 (see FIG. 3C). Thus, barrier layer 208 can allow for both ionic motion and electrical reading along the vertical axis of the device. As one skilled in the art will appreciate, a voltage threshold is necessary to allow the magnesium ions to transport through the barrier layer 208. In one embodiment, a voltage of 0.5 volts or greater can be used. In another embodiment, a voltage of 0.5 volts up to 10 volts can be used. In another embodiment, a voltage of 0.5 volts and up to 5 volts can be used. A suitable material for barrier layer 208 includes, for example, graphene, thin metal layer or a metal oxide film. The barrier layer 208 is deposited over the variable-resistance channel layer 206 by, for example, CVD, PECVD, PVD, plating, thermal or e-beam evaporation, or sputtering. According to one or more embodiments, the barrier layer 208 can have a thickness of about 0.1 to about 100 nm. The thickness of the barrier layer 208 however is not intended to be limited and can be tailored to the particular application.

FIG. 3C is a cross-sectional side view of a reservoir layer 210 arranged on barrier layer 208. Reservoir layer 210 can be made of any of the same materials and deposited in the same manner as discussed above for reservoir layer 112.

FIG. 3D is a cross-sectional side view of a gate electrode 212 arranged on reservoir layer 210. Gate electrode 212 can be made of any of the same materials and deposited in the same manner as discussed above for gate electrode 114.

Another exemplary embodiment includes a synaptic device comprising a channel layer disposed between a first terminal and a barrier layer. The channel layer is configured to vary in resistance based on a magnesium concentration in the channel layer. The synaptic device further comprises a magnesium reservoir layer disposed over the barrier layer and configured to conduct magnesium ions through the barrier layer at a threshold applied input signal. The synaptic device further comprises a second terminal disposed over the magnesium reservoir layer and configured to apply a signal to the magnesium reservoir layer.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or any other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A synaptic device, comprising:
   a channel layer disposed between a first terminal and a barrier layer, wherein the channel layer is configured to vary in resistance based on a magnesium concentration in the channel layer;
   a magnesium reservoir layer disposed on the barrier layer and configured to conduct magnesium ions through the barrier layer at a threshold applied input signal; and
   a second terminal disposed on the magnesium reservoir layer and configured to apply a signal to the magnesium reservoir layer.

2. The synaptic device of claim 1, wherein the channel layer comprises one or more metal oxides.

3. The synaptic device of claim 1, wherein the barrier layer comprises one or more of graphene, a metal layer or a metal oxide film.

4. The synaptic device of claim 1, wherein the barrier layer has a thickness of about 0.1 to about 100 nanometers.

5. The synaptic device of claim 1, wherein the barrier layer is configured to transport the magnesium ions through the barrier layer at a voltage of 0.5 volts or greater.

6. The synaptic device of claim 1, wherein the barrier layer is configured to transport the magnesium ions through the barrier layer at a voltage of 0.5 volts up to 10 volts.

7. The synaptic device of claim 1, wherein the magnesium reservoir layer comprises metal oxides or carbon-based compounds.

8. The synaptic device of claim 1, wherein the second terminal comprises one or more of aluminum, copper, platinum, gold, tungsten, titanium, carbon, nitrogen, TiN, TiAlC, AlC and TiC.

9. The synaptic device of claim 1, which is in a stacked configuration on a substrate.

10. An integrated circuit, comprising:
    one or more semiconductor structures, wherein at least one of the one or more semiconductor structures comprises:
    a channel layer disposed between a first terminal and a barrier layer, wherein the channel layer is configured to vary in resistance based on a magnesium concentration in the channel layer;
    a magnesium reservoir layer disposed on the barrier layer and configured to conduct magnesium ions through the barrier layer at a threshold applied input signal; and
    a second terminal disposed on the magnesium reservoir layer and configured to apply a signal to the magnesium reservoir layer.

11. The integrated circuit of claim 10, wherein the channel layer comprises one or more metal oxides.

12. The integrated circuit of claim 10, wherein the barrier layer comprises one or more of graphene, a metal layer or a metal oxide film.

13. The integrated circuit of claim 10, wherein the barrier layer has a thickness of about 0.1 to about 100 nanometers.

14. The integrated circuit of claim 10, wherein the barrier layer is configured to transport the magnesium ions through the barrier layer at a voltage of 0.5 volts or greater.

15. The integrated circuit of claim 10, wherein the barrier layer is configured to transport the magnesium ions through the barrier layer at a voltage of 0.5 volts up to 10 volts.

16. The integrated circuit of claim 10, wherein the magnesium reservoir layer comprises metal oxides or carbon-based compounds.

17. The integrated circuit of claim 10, wherein the second terminal comprises one or more of aluminum, copper, platinum, gold, tungsten, titanium, carbon, nitrogen, TiN, TiAlC, AlC and TiC.

18. The integrated circuit of claim 10, wherein the at least one of the one or more semiconductor structures is in a stacked configuration on a substrate.

19. A method of fabricating a synaptic device, the method comprising:
    forming a channel layer over a first terminal, wherein the channel layer varies in resistance based on a magnesium concentration in the channel layer;
    forming a barrier layer over the channel layer;
    forming a magnesium reservoir layer over the barrier layer, wherein the magnesium reservoir layer is configured to transport magnesium ions through the barrier layer at a threshold applied input signal; and
    forming a second terminal over the magnesium reservoir layer for applying the signal to the magnesium reservoir layer.

20. The method of claim 19, wherein the synaptic device is in a stacked configuration on a substrate.

* * * * *